United States Patent
Ikoma et al.

(10) Patent No.: US 8,081,099 B2
(45) Date of Patent: Dec. 20, 2011

(54) D/A CONVERTER, DIFFERENTIAL SWITCH, SEMICONDUCTOR INTEGRATED CIRCUIT, VIDEO APPARATUS, AND COMMUNICATION APPARATUS

(75) Inventors: Heiji Ikoma, Nara (JP); Junji Nakatsuka, Osake (JP)

(73) Assignee: Panasonic Corporation, Osaka (JP)

( * ) Notice: Subject to any disclaimer, the term of this patent is extended or adjusted under 35 U.S.C. 154(b) by 47 days.

(21) Appl. No.: 12/439,983

(22) PCT Filed: Jul. 9, 2008

(86) PCT No.: PCT/JP2008/001836
§ 371 (c)(1),
(2), (4) Date: Mar. 4, 2009

(87) PCT Pub. No.: WO2009/028130
PCT Pub. Date: Mar. 5, 2009

(65) Prior Publication Data
US 2010/0182180 A1    Jul. 22, 2010

(30) Foreign Application Priority Data
Aug. 28, 2007 (JP) ................................. 2007-220535

(51) Int. Cl.
*H03M 1/66* (2006.01)
(52) U.S. Cl. ........ 341/144; 327/382; 327/427; 345/211; 330/260

(58) Field of Classification Search .......... 341/136–170; 326/95; 345/211; 323/136; 330/257, 292, 330/253, 285, 252, 254, 260; 327/427, 382, 327/390, 157, 434, 436, 543, 417, 112, 534
See application file for complete search history.

(56) References Cited

U.S. PATENT DOCUMENTS

| | | | |
|---|---|---|---|
| 6,218,892 B1 | 4/2001 | Soumyanath et al. | |
| 6,232,827 B1 | 5/2001 | De et al. | |
| 6,738,006 B1 * | 5/2004 | Mercer et al. | 341/144 |
| 6,759,875 B2 * | 7/2004 | Mano et al. | 326/95 |
| 6,864,539 B2 | 3/2005 | Ishibashi et al. | |
| 6,967,609 B1 * | 11/2005 | Bicakci et al. | 341/144 |
| 6,980,055 B2 * | 12/2005 | Gharpurey | 330/257 |

(Continued)

FOREIGN PATENT DOCUMENTS

JP         04-192703         7/1992

(Continued)

OTHER PUBLICATIONS

Komatsu, Yoshihide et al., "Substrate-Noise and Random-Variability Reduction with Self-Adjusted Forward Body Bias," IEICE Trans Electron, vol. E90-C, No. 4 Apr. 2007.

*Primary Examiner* — Lam T Mai
(74) *Attorney, Agent, or Firm* — McDermott Will & Emery LLP

(57) ABSTRACT

In a D/A converter that has a plurality of current sources (IS1, IS2 and IS3-1 to IS3-63) each including a transistor, and is for converting an input digital signal into an analog signal by selecting paths of currents output from the current sources (IS1, IS2 and IS3-1 to IS3-63), depending on the digital signal, a forward body bias voltage is applied to a back-gate terminal of the transistor included in each current source (IS1, IS2 and IS3-1 to IS3-63).

30 Claims, 11 Drawing Sheets

U.S. PATENT DOCUMENTS

| | | | |
|---|---|---|---|
| 7,292,172 B2 * | 11/2007 | Matsumoto et al. | 341/144 |
| 7,405,525 B2 * | 7/2008 | Hoppe et al. | 318/135 |
| 7,489,261 B1 * | 2/2009 | Kuttner | 341/136 |
| 7,675,442 B2 * | 3/2010 | Kuttner | 341/136 |
| 2002/0044076 A1 | 4/2002 | Yao et al. | |
| 2002/0084925 A1 | 7/2002 | Dedic et al. | |
| 2002/0163377 A1 | 11/2002 | Bruneau et al. | |
| 2004/0014268 A1 | 1/2004 | Ishibashi et al. | |
| 2005/0230758 A1 | 10/2005 | LeReverend | |
| 2009/0309775 A1 * | 12/2009 | Ikoma | 341/144 |

FOREIGN PATENT DOCUMENTS

| | | | | |
|---|---|---|---|---|
| JP | 02001024511 | * | 1/2001 | 341/144 |
| JP | 2005-311359 | | 11/2005 | |

* cited by examiner

US 8,081,099 B2

D/A CONVERTER, DIFFERENTIAL SWITCH, SEMICONDUCTOR INTEGRATED CIRCUIT, VIDEO APPARATUS, AND COMMUNICATION APPARATUS

RELATED APPLICATIONS

This application is the U.S. National Phase under 35 U.S.C. §371 of International Application No. PCT/JP2008/001836, filed on Jul. 9, 2008, which in turn claims the benefit of Japanese Application No. 2007-220535, filed on Aug. 28, 2007, the disclosures of which Applications are incorporated by reference herein.

TECHNICAL FIELD

The present invention relates to a D/A converter (DAC) for converting a digital signal into an analog signal, a differential switch, a semiconductor integrated circuit, a video apparatus, and a communication apparatus. More particularly, the present invention relates to a technique for improving linearity characteristics and distortion characteristics of a D/A converter.

BACKGROUND ART

In recent years, as various video apparatuses and communication apparatuses are introduced on the market, semiconductor integrated circuit devices for use in those apparatuses are increasingly developed. The scales of the semiconductor integrated circuit devices are significantly increased, leading to a large demand for higher performance, higher speed, more functions, smaller size, lower power consumption and the like.

In such circumstances, various electronic apparatuses, when transmitting a signal from the inside to the outside of a semiconductor integrated circuit, employ various types of D/A converters, depending on the application (e.g., a control system, a display system, a video system, an audio system, a communication system, etc.), so as to convert a digital signal into an analog signal. For example, in LSIs for video applications, communication applications and the like, a current steering D/A converter that can perform a high-speed operation of several tens of megahertz to several hundreds of megahertz or several gigahertz is essentially required. Also, in order to achieve a higher-performance video apparatus or communication apparatus, a D/A converter having a higher resolution and a higher accuracy is required, and therefore, a higher-performance D/A converter is strongly desired.

An exemplary conventional D/A converter will be described as follows.

FIG. 11 is a diagram showing a circuit configuration of a conventional current steering D/A converter. The D/A converter 400 of FIG. 11 is an 8-bit D/A converter that comprises a plurality of current sources (IS1, IS2 and IS3-1 to IS3-63), a plurality of differential switches (SW1, SW2 and SW3-1 to SW3-63), a bias circuit 401, and a decoder circuit 402.

The differential switches (SW1, SW2 and SW3-1 to SW3-63) have different transistor sizes, but have the same configuration, i.e., each comprises two P-channel transistors (P-channel transistors 406 and 407), as shown in FIG. 11.

Also, the current sources have different transistor sizes, but have the same configuration.

The current source IS1 is a 1-LSB current source, the current source IS2 is a 2-LSB current source, and the current sources IS3-1 to IS3-63 are each a 4-LSB current source. Combinations of these current sources represent eight bits, i.e., 256 levels of gray. The currents of these current sources are determined by a first bias voltage VB1 and a second bias voltage VB2 generated in the bias circuit 401. The differential switches (SW1, SW2 and SW3-1 to SW3-63) are controlled in accordance with decoded signals D1, D2 and D3-1 to D3-63 obtained by decoding input digital codes IN0 to IN7 by the decoder circuit 402 and their inverted decoded signals D1B, D2B and D3-1B to D3-63B, respectively. Thereby, the differential switches SW1, SW2 and SW3-1 to SW3-63 switch the destinations of currents from the respective corresponding current sources between an analog non-inversion output terminal OUT and an analog inversion output terminal NOUT.

Thereafter, the currents from the current sources are added at the analog non-inversion output terminal OUT or the analog inversion output terminal NOUT, so that an analog output current corresponding to the input digital codes is output. The analog output current is converted into a voltage by a resistor 403-1 or a resistor 403-2 for current-voltage conversion, so that an analog output voltage corresponding to the input digital codes is obtained.

The current sources IS1, IS2 and IS3-1 to IS3-63 each include two P-channel transistors (P-channel transistors 404 and 405) that are cascade-connected. The transistor to the gate terminal of which VB1 is applied is a transistor (hereinafter referred to as a current source transistor) for determining a current value, and the transistor to the gate terminal of which VB2 is applied is a transistor (hereinafter referred to as a cascode transistor) that is cascade-connected to the current source transistor so as to improve the output impedance of the current source (i.e., improve the constant-current characteristics).

In general, if a cascode transistor is connected to a current source transistor, the output impedance of the current source is about gm/gds times as large as the output impedance of the current source transistor (gm and gds are of the cascode transistor).

Typically, both the back-gate terminals of the current source transistor and the cascode transistor are connected to a power source VDD.

The bias circuit 401 comprises a first bias transistor 401a, a second bias transistor 401b, and a current source that are connected as shown in FIG. 11. The bias circuit 401 outputs the first bias voltage VB1 and the second bias voltage VB2. In this case, the back-gate terminals of the first bias transistor 401a and the second bias transistor 401b in the bias circuit 401 that are paired with the current source transistor and the cascode transistor, respectively, of each of the current sources IS1, IS2 and IS3-1 to IS3-63 into current mirror circuits, are connected to the power source VDD.

Incidentally, representative characteristics of a D/A converter generally include linearity characteristics and distortion characteristics.

In the D/A converter 400, the relative accuracy and output impedance of a current source need to be improved so as to achieve more accurate linearity and lower distortion.

Firstly, in order to increase the accuracy of the D/A converter 400, the relative accuracy of the output current of each current source needs to be improved. In general, the relative accuracy (mismatch) of the threshold (Vt) and the current of a transistor are proportional to $1/\sqrt{[L \times W]}$ (L: the gate length, W: the gate width). Therefore, the current source transistor is conventionally designed to have a larger area so that variations therein are reduced, so as to improve the relative accuracy of the output current.

Also, conventionally, in order to increase the output impedances of the current sources IS1, IS2 and IS3-1 to IS3-63, the gm/gds of the cascode transistor is increased, thereby improving the output impedance of the whole current source. Specifically, in order to increase the gm (transconductance) of the cascode transistor, and to decrease the gds (drain conductance) of the cascode transistor, the W/L ratio is increased while increasing the L of the cascode transistor, thereby increasing the size of the cascode transistor.

Also, a mismatch between the pair transistors included in the differential switch may be responsible for a deterioration in distortion characteristics. Therefore, such a mismatch is conventionally suppressed by increasing the sizes of the pair transistors.

Incidentally, it has been disclosed that, as a method for reducing variations in threshold and current of a transistor, a forward body bias is applied to the back-gate terminal of the transistor (see, for example, Non-Patent Document 1). In this case, as a means for generating the forward body bias voltage, a method for causing a current to flow through a parasitic diode between the source terminal and the back-gate terminal of the transistor has been disclosed (see, for example, Non-Patent Document 1 and Patent Document 1).

Also, a means for applying a forward body bias to the back-gate terminals of the differential pair transistors of a differential amplifier to improve the gm of each of the differential pair transistors and reduce the gds thereof (particularly, suppress the short-channel effect), and as a result, increase the gain (gm/gds) of the differential amplifier, has been disclosed (see, for example, Patent Document 2).

Also, it has been disclosed that, as a method for applying a forward body bias, a bias current to be extracted from the well of a MOS transistor is determined, and the determined bias current is extracted from the well, thereby applying a bias from an external circuit to the well (see, for example, Patent Document 3).

Non-Patent Document 1: Y. Komatsu et al., "Substrate-Noise and Random-Variability Reduction with Self-Adjusted Forward Body Bias", IEICE TRANSACTIONS on Electronics, 2007 vol. E90-C, No. 4, p. 692-698

Patent Document 1: U.S. Pat. No. 6,864,539

Patent Document 2: U.S. Pat. No. 6,218,892

Patent Document 3: Japanese Unexamined Patent Application Publication No. 2005-311359

DISCLOSURE OF THE INVENTION

Problems to be Solved by the Invention

However, if the size of the current source transistor, the cascode transistor or the differential switch transistor is increased so as to improve the accuracy or the constant-current characteristics, the size of a matrix of the current source transistors or the cascode transistors rapidly increases. As a result, the area of the D/A converter increases, leading to an increase in cost.

Also, if the size of a transistor is increased, the parasitic capacitance increases, so that the frequency characteristics, such as distortion characteristics or the like, deteriorate, i.e., the accuracy of the D/A converter deteriorates.

In view of the aforementioned problems, the present invention has been achieved. An object of the present invention is to increase the accuracy of a D/A converter while suppressing an increase in area of the D/A converter.

Solution to the Problems

To achieve the object, according to a first aspect of the present invention, a D/A converter is provided which has a plurality of current sources each including a transistor, and is for converting an input digital signal into an analog signal by selecting paths of currents output from the plurality of current sources, depending on the digital signal. A forward body bias voltage is applied to a back-gate terminal of the transistor included in each current source.

Thereby, the relative accuracy of the transistor of the current source, i.e., the relative accuracy of a current of each current source, is improved. In other words, the linearity accuracy of the D/A converter can be increased. Therefore, the transistor size does not need to be increased so as to improve the accuracy, and the accuracy of the D/A converter can be increased while suppressing an increase in area of the D/A converter. In addition, since the output impedance of the current source is improved, the linearity characteristics and the distortion characteristics (particularly, the frequency dependency) of the D/A converter can be improved.

According to a second aspect of the present invention, in the D/A converter of the first aspect, each current source includes a current source transistor and a cascode transistor, and the forward body bias voltage is applied to at least one of the back-gate terminal of the current source transistor and the back-gate terminal of the cascode transistor.

Thereby, when the forward body bias voltage is applied to the current source transistor, the relative accuracy of a current of each current source is improved. In other words, the linearity accuracy of the D/A converter can be increased. Also, when the forward body bias voltage is applied to the cascode transistor, the gm/gds of the cascode transistor is improved, so that the output impedance of the current source is improved. In other words, the linearity characteristics and the distortion characteristics (particularly, the frequency dependency) of the D/A converter can be improved.

According to a third aspect of the present invention, in the D/A converter of the second aspect, the forward body bias voltage is generated by connecting a forward body bias voltage generating current source in series to a parasitic diode existing between a source terminal and the back-gate terminal of the transistor to which the forward body bias voltage is applied.

Thereby, the forward body bias voltage can be easily generated.

According to a fourth aspect of the present invention, in the D/A converter of the third aspect, the transistors of the current sources are arranged and separated into a current source transistor matrix including the current source transistors of the current sources and a cascode transistor matrix including the cascode transistors of the current sources.

Thereby, the transistors are more efficiently arranged. Therefore, it is possible to increase the accuracy of the D/A converter while suppressing an increase in circuit area.

According to a fifth aspect of the present invention, in the D/A converter of the fourth aspect, the forward body bias voltage generating current source is connected to a connection point provided at a center of the current source transistor matrix or the cascode transistor matrix.

According to a sixth aspect of the present invention, in the D/A converter of the fourth aspect, a plurality of the forward body bias voltage generating current sources are provided. One of the plurality of forward body bias voltage generating current sources is connected to a connection point provided at a center of the current source transistor matrix or the cascode transistor matrix. The other forward body bias voltage generating current sources are connected to positions that are symmetrical about the connection point.

According to a seventh aspect of the present invention, in the D/A converter of the fourth aspect, the current source transistor matrix or the cascode transistor matrix is segmented. The forward body bias voltage generating current sources are provided for the respective corresponding segments.

In each of these aspects, the forward body bias voltages applied to the transistors can be caused to be uniform.

According to an eighth aspect of the present invention, the D/A converter of the second aspect, further includes a bias circuit for outputting a first bias voltage and a second bias voltage. The bias circuit includes a first bias transistor and a second bias transistor, the first bias transistor and the current source transistor forming a current mirror pair and the second bias transistor and the cascode transistor forming a current mirror pair. A common forward body bias voltage is applied to a back-gate terminal of the current source transistor of each current source and a back-gate terminal of the first bias transistor.

According to a ninth aspect of the present invention, the D/A converter of the second aspect, further includes a bias circuit for outputting a first bias voltage and a second bias voltage. The bias circuit includes a first bias transistor and a second bias transistor, the first bias transistor and the current source transistor forming a current mirror pair and the second bias transistor and the cascode transistor forming a current mirror pair. A common forward body bias voltage is applied to a back-gate terminal of the cascode transistor of each current source and a back-gate terminal of the second bias transistor.

In each of these aspects, the current of the bias circuit can be duplicated for each current source with high accuracy.

According to a tenth aspect of the present invention, in the D/A converter of the eighth aspect, the first bias transistor is provided in a region in which the current source transistor matrix is provided.

According to an eleventh aspect of the present invention, in the D/A converter of the ninth aspect, the second bias transistor is provided in a region in which the cascode transistor matrix is provided.

In each of these aspects, the uniformity of the transistors in the bias circuit and the transistors in the current source is increased, so that the current mirror accuracy can be further improved.

According to a twelfth aspect of the present invention, in the D/A converter of the second aspect, the back-gate terminal of the current source transistor and the back-gate terminal of the cascode transistor are a common back-gate terminal shared by the current source transistor and the cascode transistor, and the forward body bias voltage is generated by connecting a forward body bias voltage generating current source in series to a parasitic diode existing between a source terminal and the back-gate terminal of the current source transistor.

Thereby, the transistors can be efficiently arranged, so that it is possible to increase the accuracy of the D/A converter while suppressing an increase in circuit area.

Also, according to a thirteenth aspect of the present invention, a D/A converter is provided which has a plurality of current sources each including a transistor, and is for converting an input digital signal into an analog signal by selecting paths of currents output from the plurality of current sources, depending on the digital signal. The D/A converter further includes a plurality of differential switches connected to the respective corresponding current sources. Each of the differential switches includes transistors that are switched, depending on the digital signal given a path of a current from the corresponding current source. A forward body bias voltage is applied to back-gate terminals of the transistors of each of the differential switches.

Thereby, it is possible to increase the output impedance of the current source including the differential switch, and at the same time, improve the relative accuracy of the transistors of the differential switch, thereby improving the distortion characteristics (particularly, the frequency dependency).

According to a fourteenth aspect of the present invention, in the D/A converter of the thirteenth aspect, the forward body bias voltage applied to the back-gate terminals of the transistors of each of the differential switches, is generated by connecting a forward body bias voltage generating current source in series to parasitic diodes existing between source terminals and the back-gate terminals of the transistors of the differential switch.

Thereby, it is possible to easily generate the forward body bias voltage.

According to fifteenth, sixteenth and seventeenth aspects of the present invention, in the D/A converters of the third, twelfth and fourteenth aspects, respectively, the forward body bias voltage generating current source is configured so that a current value is set by a control signal.

In each of these aspects, the output of the forward body bias voltage generating current source is set to have an optimal current value.

According to eighteenth and nineteenth aspects of the present invention, the D/A converter of the first and thirteenth aspects, respectively, each further include a bias voltage generating circuit for generating a predetermined voltage. The forward body bias voltage is the voltage generated by the bias voltage generating circuit.

In each of these aspects, it is possible to easily achieve a D/A converter in which a forward body bias voltage is applied.

Also, according to a twentieth aspect of the present invention, in the D/A converter of the thirteenth aspect, each current source includes a current source transistor and a cascode transistor, and the forward body bias voltage is applied to at least one of the back-gate terminal of the current source transistor and the back-gate terminal of the cascode transistor.

Thereby, the relative accuracy of the current source transistor of each current source, i.e., the relative accuracy of a current of each current source, is improved. In other words, the linearity accuracy of the D/A converter can be increased. Also, the gm/gds of the cascade transistor of the current source matrix is improved, and the output impedance of the current source matrix is improved. In other words, the linearity characteristics and the distortion characteristics (particularly, the frequency dependency) of the D/A converter can be improved. Also, the relative accuracy of the relative accuracy of the pair transistors of the differential switch is improved.

According to twenty-first and twenty-second aspects of the present invention, semiconductor integrated circuits including the D/A converters of the first and thirteenth aspects, respectively, are provided.

In each of these aspects, a semiconductor integrated circuit including a D/A converter having a high level of linearity accuracy or excellent distortion characteristics can be provided.

Also, according to twenty-third and twenty-fourth aspects of the present invention, video apparatuses including the semiconductor integrated circuits of the twenty-first and twenty-second aspects, respectively, are provided.

In each of these aspects, a video apparatus including a D/A converter having a high level of linearity accuracy can be provided.

Also, according to twenty-fifth and twenty-sixth aspects of the present invention, communication apparatuses including the semiconductor integrated circuits of the twenty-first and twenty-second aspects, respectively, are provided.

In each of these aspects, a communication apparatus including a D/A converter having excellent distortion characteristics can be provided.

Also, according to a twenty-seventh aspect of the present invention, in the D/A converter of the fourteenth aspect, the forward body bias voltage generating current source is provided for each of the differential switches. To the back-gate terminals of the transistors of each of the differential switches, the corresponding forward body bias voltage generating current source is connected.

Thereby, changes in voltage at the common source node of each differential switch when a control signal for controlling the differential switch is switched and when the output voltage changes, do not have an influence on the other differential switches.

According to a twenty-eighth aspect of the present invention, a differential switch is provided which includes a pair of transistors having source terminals connected to each other. A forward body bias voltage is generated by causing a current to flow through a parasitic diode between the source terminal and a back-gate terminal, thereby applying the forward body bias voltage to the back-gate terminal.

Thereby, when the voltage of the source terminal of the differential switch changes, the voltage of the back-gate terminal of the differential switch is determined, depending on the change. As a result, it is possible to reduce a deterioration in distortion characteristics of an analog output due to the parasitic capacitance of the common source node of the differential switch.

According to a twenty-ninth aspect, in the differential switch of the twenty-eighth aspect, a capacitance element is connected between the source terminal and the back-gate terminal.

Thereby, when the voltage of the common source node of the differential switch changes, the ability of causing the back-gate terminal voltage to follow the change is increased due to the connected capacitance element. As a result, it is possible to further reduce a deterioration in distortion characteristics of an analog output due to the parasitic capacitance of the common source node of the differential switch.

According to a thirtieth aspect of the present invention, a D/A converter is provided which includes a plurality of current sources, and the differential switch of the twenty-eighth aspect provided for each of the current sources and connected to a path of a current output from the each of the current sources. Paths of currents output from the plurality of current sources are selected by the differential switches in accordance with an input digital signal, thereby converting the input digital signal into an analog signal.

Thereby, it is possible to improve the output impedance of the current source including the transistors of the differential switch. In addition, the voltage of the back-gate terminal changes, depending on a change in voltage of the common source node of the transistors of the differential switch. As a result, it is possible to provide a D/A converter in which a deterioration in distortion characteristics due to an influence of the parasitic capacitance of the differential switch common node is reduced.

Effect of the Invention

According to the present invention, it is possible to increase the accuracy of a D/A converter while suppressing an increase in area of the D/A converter.

DESCRIPTION OF THE REFERENCE CHARACTERS

Figure 1:
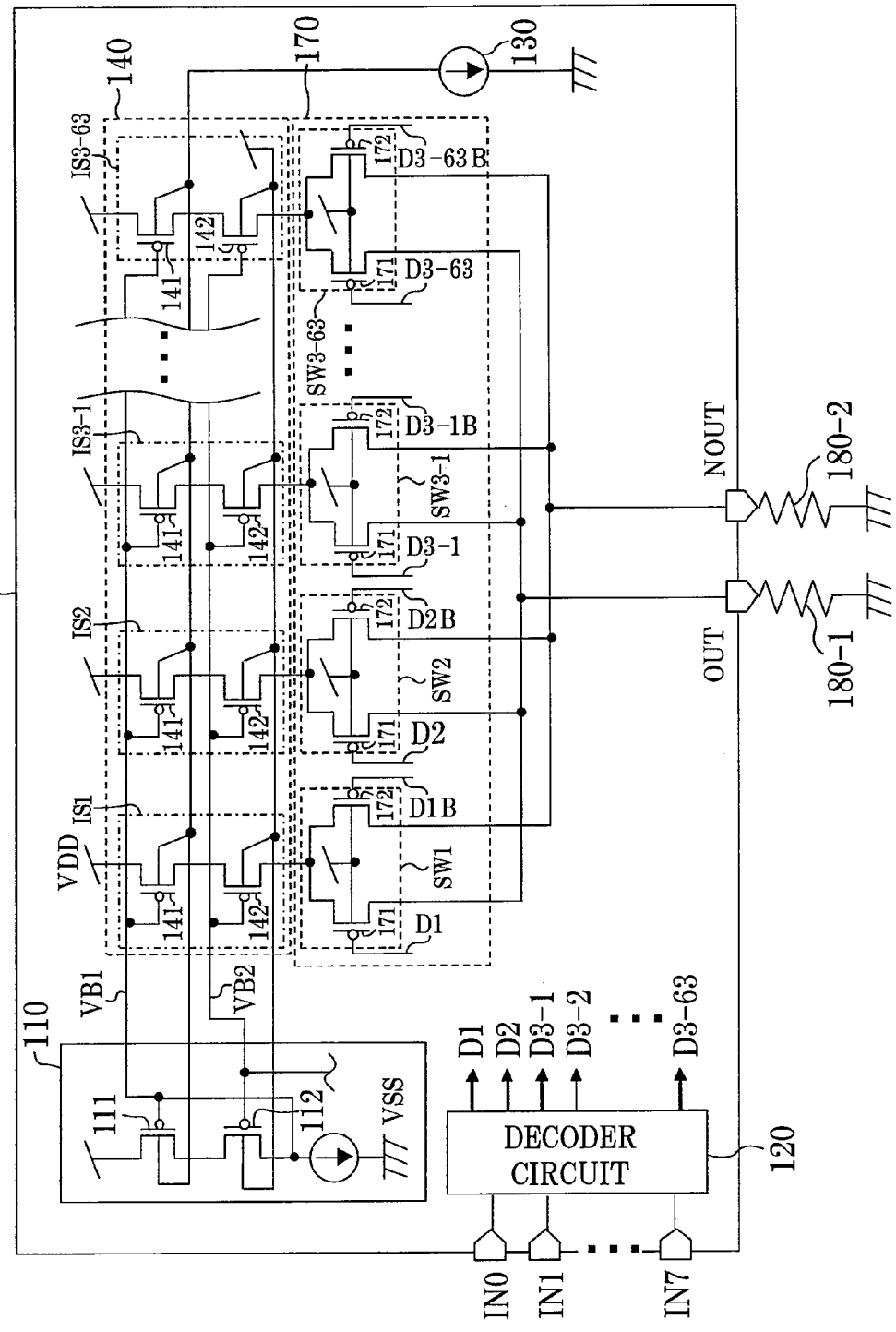
FIG. 1 is a block diagram showing a configuration of a D/A converter according to Embodiment 1 of the present invention.

100 D/A converter
110 bias circuit
111 first bias transistor
112 second bias transistor
120 decoder circuit
130 forward body bias voltage generating current source
140 current source group
141 current source transistor
142 cascode transistor
150 current source transistor matrix
160 cascode transistor matrix
170 differential switch group
171 non-inverted output transistor
172 inverted output transistor
180 resistor
200, 300, 500, 600 D/A converter
700 communication apparatus
710 antenna
720 semiconductor integrated circuit
730 baseband processor
VB1 first bias voltage
VB2 second bias voltage
IN0 to IN7 input digital code
IS1, IS2, IS3-1 to IS3-63 current source
SW1, SW2, SW3-1 to SW3-63 differential switch D1, D2 and D3-1 to D3-63 decoded signal
D1B, D2B, D3-1B to D3-63B inverted decoded signal

BEST MODE FOR CARRYING OUT THE
INVENTION

Hereinafter, embodiments of the present invention will be described with reference to the accompanying drawings. A D/A converter described in each of the embodiments below is employed in, for example, semiconductor integrated circuits used in video signal output units of a television, a DVD recorder, a Blu-ray (the registered trademark of the Blu-ray Disc Association) disc recorder, a mobile telephone and the like, video apparatuses having the video signal output units, semiconductor integrated circuits used in transmission units of a wireless LAN, a cable modem and the like, and communication apparatuses comprising the transmission units.

Note that, in the description of the embodiments and variations below, components having similar functions are indicated by the same reference symbols and will not be repeatedly described.

Embodiment 1 of the Invention

FIG. 1 is a block diagram showing a configuration of a D/A converter 100 according to Embodiment 1 of the present invention. The D/A converter 100 receives an 8-bit digital signal (input digital codes IN0 to IN7) from the outside, and outputs an analog output current obtained by converting the digital signal and an inverted signal of the analog output current from an analog non-inversion output terminal OUT and an analog inversion output terminal NOUT, respectively. Resistors 180-1 and 180-2 are connected to the analog non-inversion output terminal OUT and the analog inversion output terminal NOUT, respectively. The analog output currents output from the analog non-inversion output terminal OUT and the analog inversion output terminal NOUT are converted into voltages by the current-voltage conversion resistors 180-1 and 180-2, respectively, so that analog output voltages corresponding to the input digital codes are obtained.

(Configuration of D/A Converter 100)

The D/A converter 100 comprises a bias circuit 110, a decoder circuit 120, a forward body bias voltage generating current source 130, a current source group 140, and a differential switch group 170 as shown in FIG. 1.

The bias circuit 110 comprises a first bias transistor 111, a second bias transistor 112, and a current source that are connected as shown in FIG. 1, and outputs a first bias voltage VB1 and a second bias voltage VB2.

The decoder circuit 120 receives and decodes the input digital codes IN0 to IN7, and outputs the resultant decoded signals (D1, D2 and D3-1 to D3-63).

The forward body bias voltage generating current source 130 is a current source for causing a current having a predetermined value to flow.

The current source group 140 includes a plurality of current sources (IS1, IS2 and IS3-1 to IS3-63). The current sources have different transistors sizes, but the same configuration. The current source IS1 is a 1-LSB current source, the current source IS2 is a 2-LSB current source, and the current sources IS3-1 to IS3-63 are each a 4-LSB current source. Combinations of these current sources represent eight bits, i.e., 256 levels of gray. Currents output from these current sources are determined based on the first bias voltage VB1 and the second bias voltage VB2.

Specifically, each current source comprises two P-channel transistors (a current source transistors 141 and a cascode transistor 142) that are cascade-connected. Here, all the current source transistors 141 in the current source group 140 are collectively referred to as a current source transistor matrix 150 and all the cascode transistors 142 in the current source group 140 are collectively referred to as a cascode transistor matrix 160.

The current source transistor 141 is a transistor for determining a current value. The first bias voltage VB1 is applied to the gate of the current source transistor 141, and the source of the current source transistor 141 is connected to a power source VDD. Also, the current source transistor 141 and the first bias transistor 111 form a current mirror pair. The current source transistor 141 and the first bias transistor 111 also share a common back-gate terminal, which is connected to the forward body bias voltage generating current source 130.

On the other hand, the cascode transistor 142 is a transistor for improving the output impedance of the current source (improving the constant-current characteristics), which is cascade-connected to the current source transistor 141. In general, by connecting the cascode transistor 142 to the current source transistor 141, the output impedance of the current source is caused to be about gm/gds times as large as the output impedance of the current source transistor 141 (gm and gds are of the cascode transistor). Note that gm is a transconductance and gds is a drain conductance.

The second bias voltage VB2 is applied to the gate of the cascode transistor 142. The cascode transistor 142 and the second bias transistor 112 form a current mirror pair. The cascode transistor 142 and the second bias transistor 112 share a common back-gate terminal, which is connected to a power source.

The differential switch group 170 includes a plurality of differential switches (SW1, SW2 and SW3-1 to SW3-63). The differential switches SW1, SW2 and SW3-1 to SW3-63 are connected to the outputs of the current sources IS1, IS2 and IS3-1 to IS3-63, respectively.

The differential switches (SW1, SW2 and SW3-1 to SW3-63) have different transistor sizes, but have the same configuration. As shown in FIG. 1, each differential switch comprises two P-channel transistors (switch pair transistors: a non-inversion output transistor 171 and an inversion output transistor 172). Any of the decoded signals D1, D2 and D3-1 to D3-63 is input to the gate of the non-inversion output transistor 171, and its inverted decoded signal is input to the inversion output transistor 172, thereby controlling ON/OFF of the respective transistors. Specifically, D1B, D2B and D3-1B to D3-63B shown in FIG. 1 are the inverted decoded signals of D1, D2 and D3-1 to D3-63, respectively. The differential switches SW1, SW2 and SW3-1 to SW3-63 are controlled in accordance with D1 and D1B, D2 and D2B, D3-1 and D3-1B, . . . , and D3-63 and D3-63B, respectively.

The non-inversion output transistor 171 and the inversion output transistor 172 also receive the output of the cascode transistor 142 of the corresponding current source. Specifically, the non-inversion output transistor 171 and the inversion output transistor 172 of the differential switch SW1 are connected to the cascode transistor 142 of the current source IS1. Similarly, SW2 is connected to IS2, SW3-1 is connected to IS3-1, . . . , and SW3-63 is connected to IS3-63.

Thereby, each differential switch switches the destination of a current from the corresponding current source between the analog non-inversion output terminal OUT and the analog inversion output terminal NOUT, depending on the input decoded signal and inverted decoded signal.

Currents from the non-inversion output transistors 171 (i.e., currents from the current sources) are added and output at the analog non-inversion output terminal OUT. Currents from the inversion output transistors 172 (i.e., currents from the current sources) are added and output at the analog inversion output terminal NOUT.

(Operational Effect of D/A Converter 100)

In the D/A converter 100, the forward body bias voltage generating current source 130 can cause currents to flow through parasitic diodes existing between the source terminals and the back-gate terminals of the current source transistor 141 and the first bias transistor 111, thereby generating a forward body bias voltage. The forward body bias voltage is applied to the back-gate terminals of the current source transistor 141 and the first bias transistor 111.

Therefore, according to this embodiment, the relative accuracy of the current source transistor 141 included in each current source, i.e., the relative accuracy of the current of each current source, is improved. In other words, in the D/A converter 100, the linearity accuracy of the D/A converter can be increased.

For example, it is assumed that the current mismatch of each current source transistor 141 is improved from 2.0% to 1.4% (i.e., by about 30%) by applying the forward body bias. In this case, in the aforementioned 8-bit D/A converter, the current mismatch is improved by about 0.025 LSB. Similarly, in a D/A converter having a resolution of 14 bits, the current mismatch is improved by about 1.6 LSB. In a 16-bit D/A converter, the current mismatch is improved by about 6.4 LSB. Thus, a larger effect of this embodiment is obtained for a D/A converter having a higher resolution.

Also, in the D/A converter 100, the first bias transistor 111 and the current source transistor 141 share a common back-gate terminal, to which the forward body bias voltage is applied. In other words, the same forward body bias voltage is applied to the transistors forming a current mirror pair. Therefore, even when the forward body bias voltage is applied, the current of the bias circuit 110 can be duplicated for the current sources (IS1, . . . , and IS3-63) with high accuracy.

Figure 2:
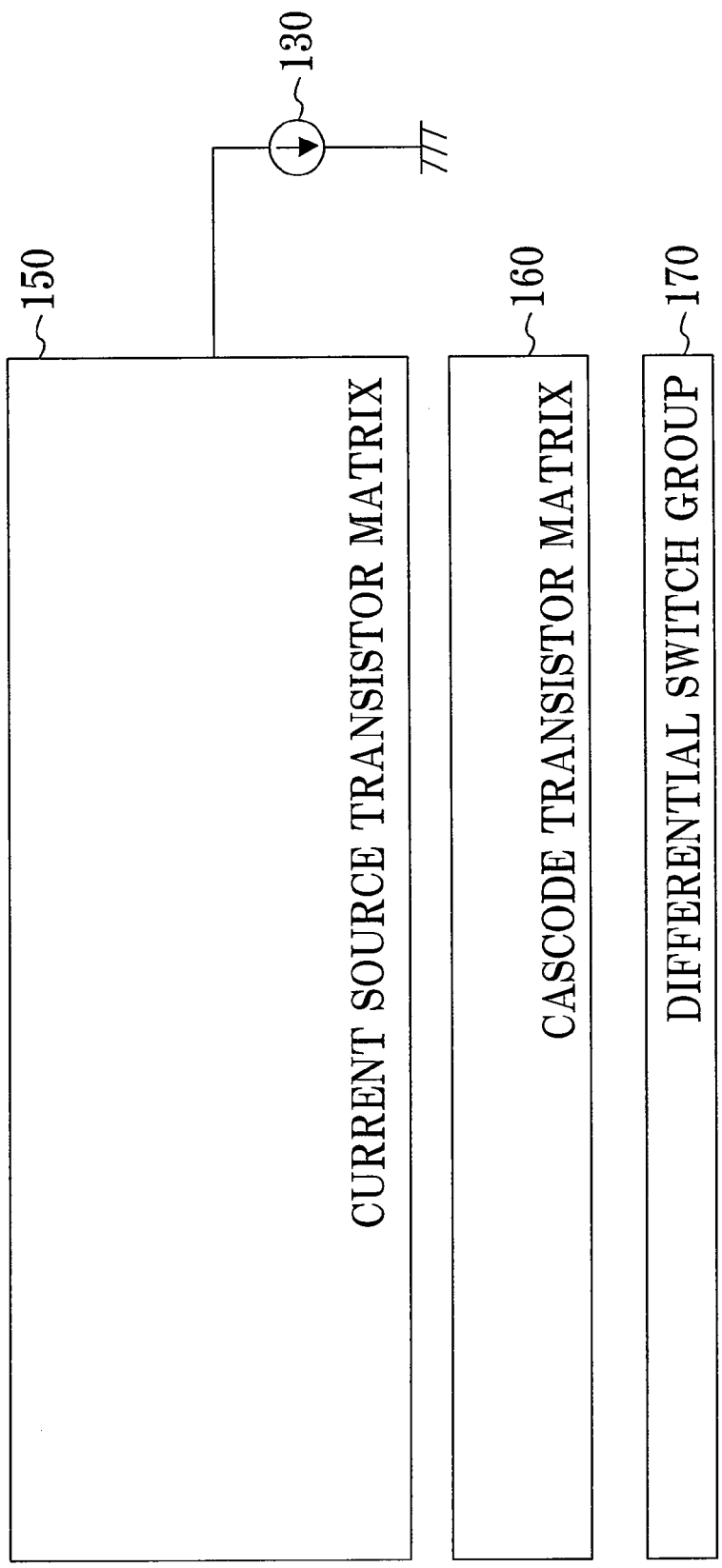
FIG. 2 is a diagram showing an exemplary arrangement of a current source group 140, a differential switch group 170 and a forward body bias voltage generating current source 130.

Note that FIG. 2 shows an exemplary arrangement of the current source group 140, the differential switch group 170 and the forward body bias voltage generating current source 130. In this example, the transistors are arranged and separated into the current source transistor matrix 150 and the cascode transistor matrix 160, below which the differential switch group 170 is provided. The current source transistor matrix 150 is connected to the forward body bias voltage generating current source 130. With this arrangement, a D/A converter can be efficiently achieved in which the circuit area can be reduced and a forward body bias can be applied. The present inventors actually made a 12-bit D/A converter to which the present invention is applied, and confirmed that the size of the current source transistor matrix 150 is reduced by about 20% (area reducing effect).

Also, a plurality of first bias transistors 111 may be distributed and arranged in the region of the current source transistor matrix 150. In this case, the uniformity of the first bias transistors 111 and the current source transistors 141 is increased, resulting in a further improvement in current mirror accuracy.

Also, the forward body bias voltage generating current source 130 is desirably connected in the vicinity of a center of the current source transistor matrix 150. In this case, the forward body bias voltage can be uniformly applied to the current source transistor matrix 150.

Figure 3:
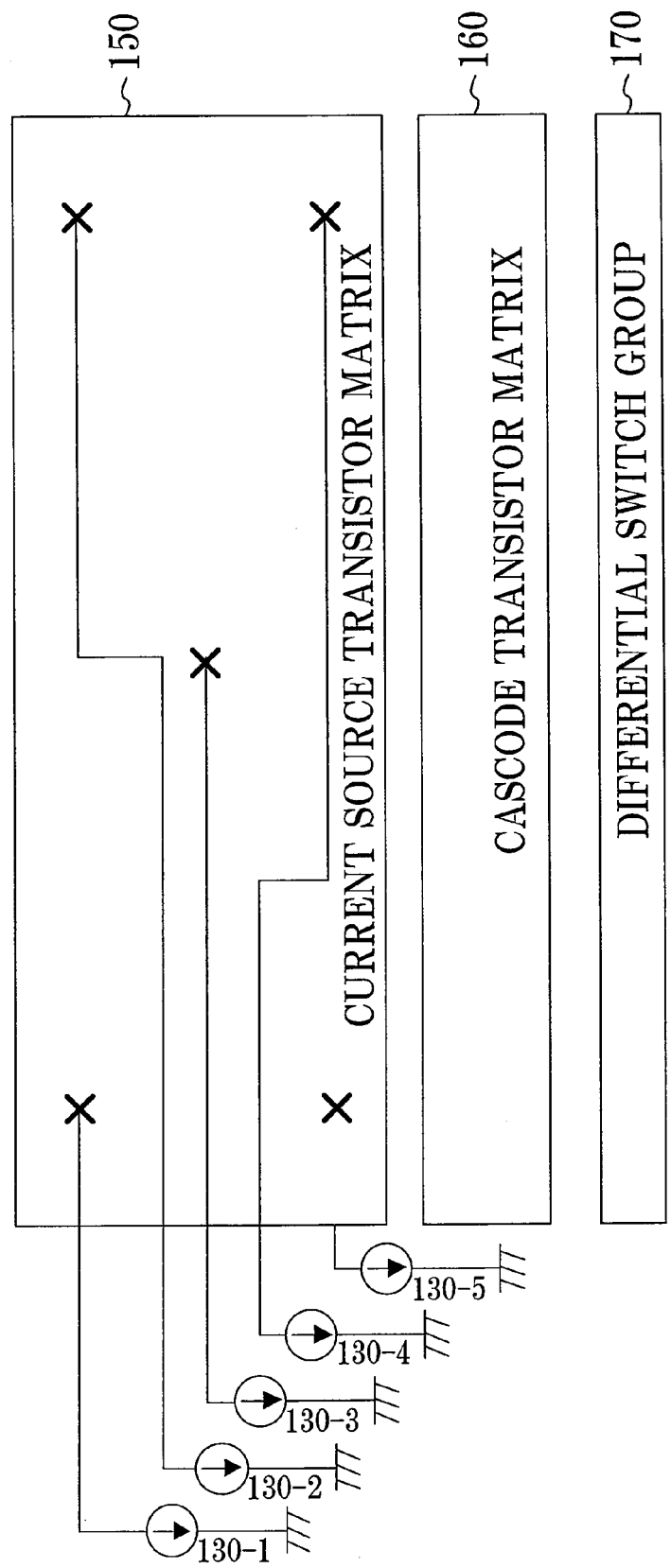
FIG. 3 is a diagram showing another exemplary arrangement of the current source group 140, the differential switch group 170 and the forward body bias voltage generating current source 130.

FIG. 3 shows a further improved version of the arrangement of FIG. 2. In the example of FIG. 3, five forward body bias voltage generating current sources 130 are provided. One of the forward body bias voltage generating current sources 130 is connected to a connection point in the vicinity of the center of the current source transistor matrix 150, while the other forward body bias voltage generating current sources 130 are connected to positions that are symmetrical about the center connection point. By such connection of the forward body bias voltage generating current sources 130, the forward body bias voltage can be more uniformly applied to the current source transistor matrix 150.

Figure 4:
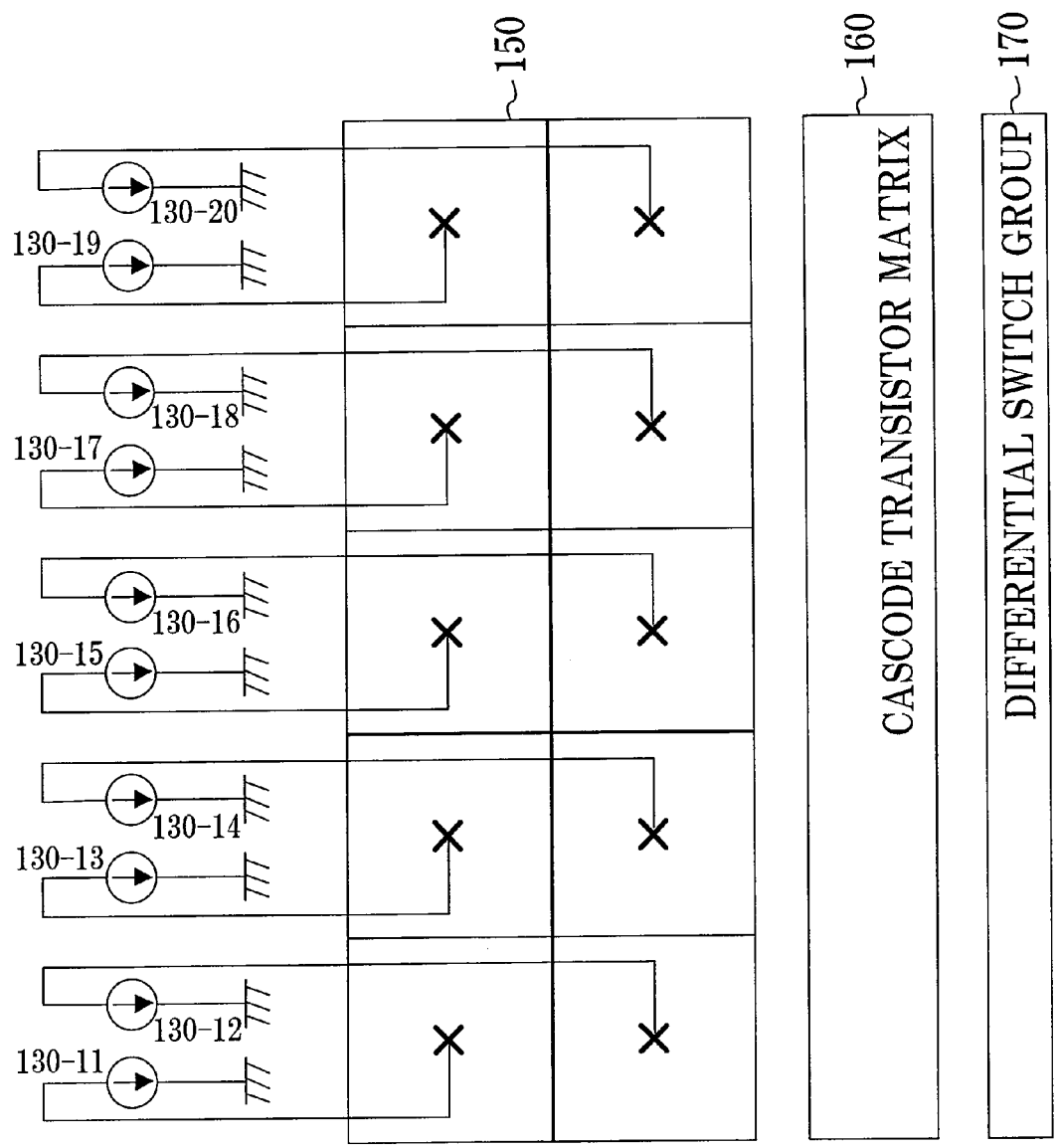
FIG. 4 is a diagram showing still another exemplary arrangement of the current source group 140, the differential switch group 170 and the forward body bias voltage generating current source 130.

FIG. 4 also shows a further improved version of the arrangement of FIG. 2. In the example of FIG. 4, the current source transistor matrix 150 is segmented into ten equal sections, and equal forward body bias voltage generating current sources 130 are connected to the respective sections. By connecting the forward body bias voltage generating current sources 130 in this manner, a forward body bias voltage can be more uniformly applied to the current source transistor matrix 150.

Embodiment 2 of the Invention

In Embodiment 2, an exemplary D/A converter will be described in which the linearity characteristics and the distortion characteristics (particularly, the frequency dependency) are improved by improving the output impedance (improving the constant-current characteristics).

Figure 5:
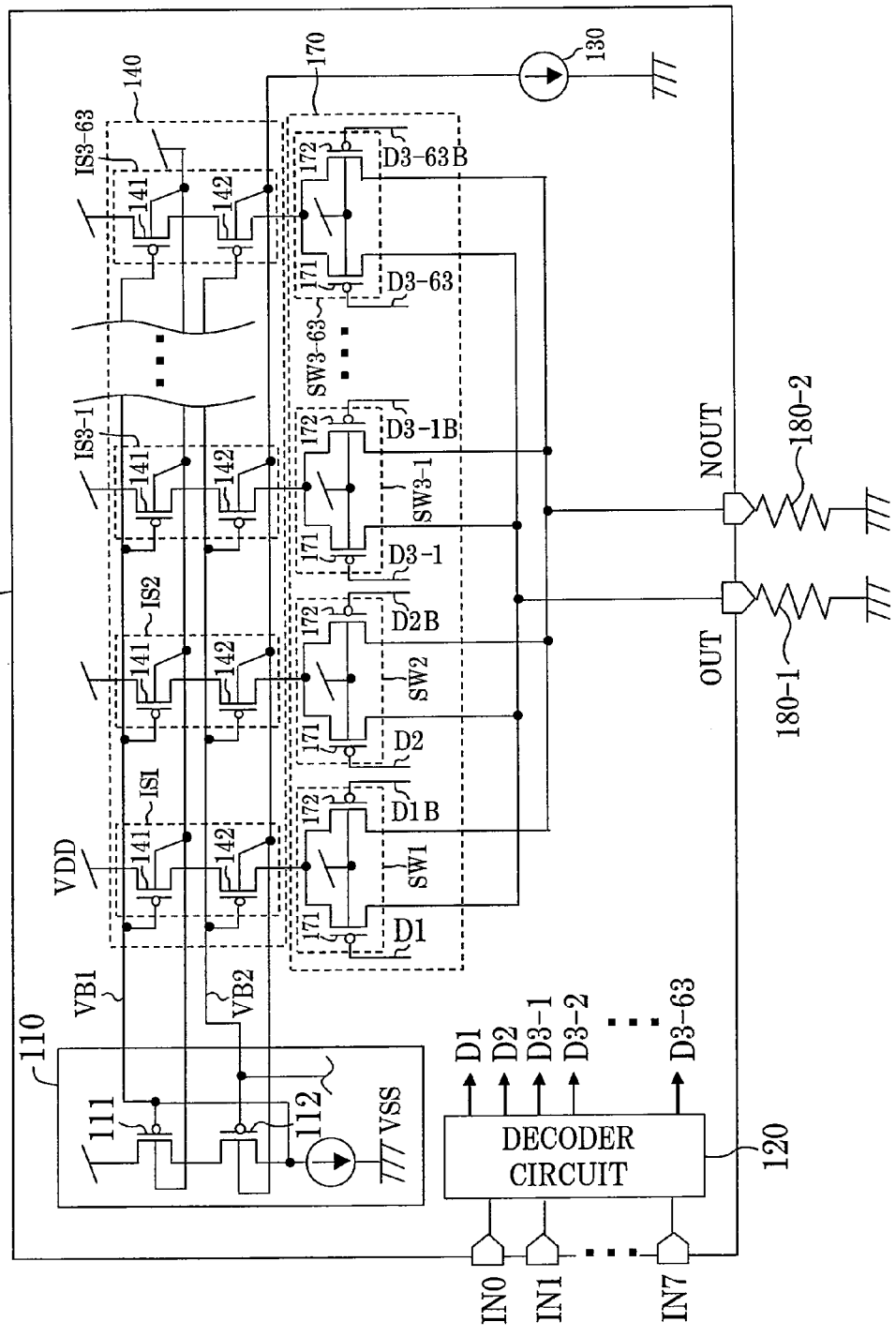
FIG. 5 is a block diagram showing a configuration of a D/A converter of Embodiment 2 of the present invention.

FIG. 5 is a block diagram showing a configuration of the D/A converter 200 of Embodiment 2 of the present invention. The D/A converter 200 is a variation of the D/A converter 100 of Embodiment 1. Specifically, in the D/A converter 200, the forward body bias voltage generating current source 130 is connected so that a forward body bias voltage is applied to the back-gate terminals of the cascode transistor 142 and the second bias transistor 112, instead of applying a forward body bias voltage to the back-gate terminals of the current source transistor 141 and the first bias transistor 111. Note that, in the D/A converter 200, the back-gate terminals of the current source transistor 141 and the first bias transistor 111 are connected to a power source.

With such a configuration, the forward body bias voltage generating current source 130 can cause currents to flow through parasitic diodes existing between the source terminals and the back-gate terminals of the cascode transistor 142 and the second bias transistor 112 in the D/A converter 200. Thereby, a forward body bias voltage can be generated. The forward body bias voltage is applied to the back-gate terminals of the cascode transistor 142 and the second bias transistor 112.

As a result, the gm/gds of the cascode transistor 142 included in the current source matrix is improved, and the output impedance of the current source is improved. In other words, according to this embodiment, the linearity characteristics and the distortion characteristics (particularly, the frequency dependency) of the D/A converter can be improved.

Incidentally, a minimum gate length (Lmin) that is allowed for a semiconductor process is typically often employed for a cascode transistor. Therefore, the benefits of the improvement of gm by application of the forward body bias voltage and the suppression of the short channel effect (i.e., the effect of reduction of gds) are large.

In other words, in this embodiment, gm/gds can be improved while the size of the cascode transistor is suppressed to a small value. Therefore, highly advantageously, there is not an increase in parasitic capacitance, and the frequency dependency of the low distortion characteristics can be improved.

Also, in this embodiment, the second bias transistor 112 and the cascode transistors in the current source matrix share the common back-gate terminal, to which the forward body bias voltage is applied. In other words, by applying the same forward body bias voltage to the transistors included in the current mirror pair, the current of the bias circuit can be duplicated with high accuracy even when the forward body bias voltage is applied.

Further, if a plurality of second bias transistors 112 are distributed and provided in the region of the cascode transistor matrix 160, the uniformity of the second bias transistors 112 and the cascode transistors 142 is increased, so that the accuracy of the current mirror can be further improved.

Note that, also in the D/A converter 200, as is similar to Embodiment 1, the current source transistor matrix 150 and the cascode transistor matrix 160 can be separately arranged, and a plurality of forward body bias voltage generating current sources 130 can be connected to positions that are symmetrical about a point or can be connected to segments of the current source transistor matrix 150.

Embodiment 3 of the Invention

In Embodiment 3, an exemplary D/A converter will be described in which the linearity characteristics and the distortion characteristics (particularly, the frequency dependency) are improved by improving the output impedance of a current source further including the transistor of a differential switch.

Figure 6:
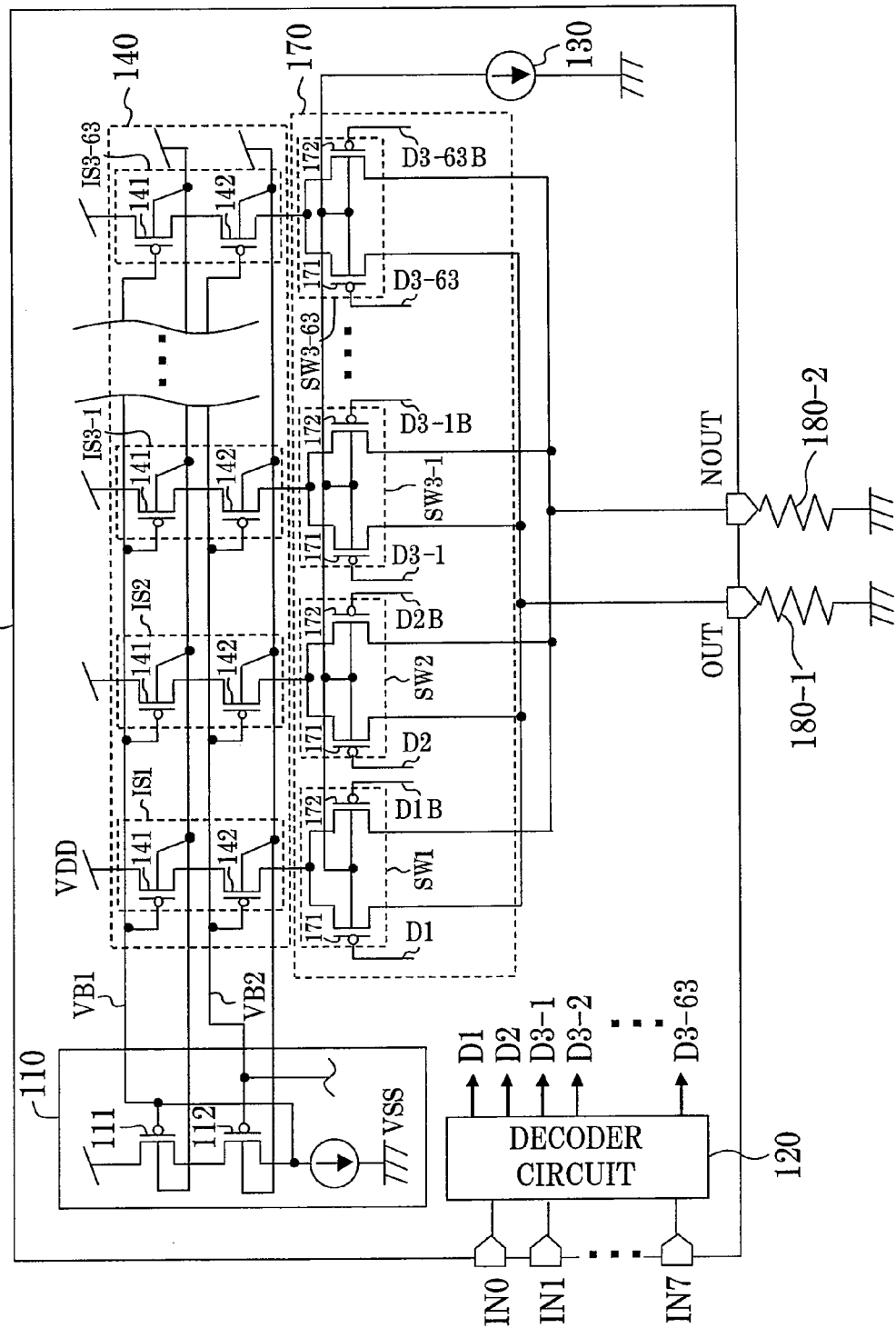
FIG. 6 is a block diagram showing a configuration of a D/A converter of Embodiment 3 of the present invention.

FIG. 6 is a block diagram showing a configuration of the D/A converter 300 of Embodiment 3 of the present invention. The D/A converter 300 is a variation of the D/A converter 100 of Embodiment 1. Specifically, in the D/A converter 300, the forward body bias voltage generating current source 130 is connected so that a forward body bias voltage is applied to the back-gate terminals of the non-inversion output transistor 171 and the inversion output transistor 172 instead of applying a forward body bias voltage to the back-gate terminals of the current source transistor 141 and the first bias transistor 111. Note that, in the D/A converter 300, the back-gate terminals of the current source transistor 141, the cascode transistor 142, the first bias transistor 111 and the second bias transistor 112 are connected to a power source.

With such a configuration, the current of the forward body bias voltage generating current source 130 can be caused to flow through parasitic diodes existing between the source terminals and the back-gate terminals of the switch pair transistors included in each differential switch. Thereby, a forward body bias voltage can be generated, and at the same time, the forward body bias voltage is applied to the transistors included in the differential switch.

As a result, the relative accuracy of the pair transistors included in the differential switch is increased. In addition, the gm/gds of the switch transistor is improved, and the output impedance of the current source is improved by the three transistors, i.e., the current source transistor, the cascode transistor and the differential switch transistor, so that the distortion characteristics (particularly, the frequency dependency) of the D/A converter can be improved.

Incidentally, a minimum gate length (Lmin) that is allowed for a semiconductor process is typically often employed for the transistors of the differential switch. Therefore, the benefits of the improvement of gm by application of the forward body bias voltage and the suppression of the short channel effect (i.e., the effect of reduction of gds) are large.

In other words, in this embodiment, advantageously, by applying the forward body bias voltage to the back-gate terminal of the pair transistors included in the differential switch, the gm/gds of the transistors of the differential switch can be improved and the output impedance of the current source including the differential switch can be increased while suppressing an increase in circuit area and parasitic capacitance. At the same time, the relative accuracy of the pair transistors included in the differential switch can be improved, so that the distortion characteristics (particularly, the frequency dependency) can be improved.

Embodiment 4 of the Invention

In Embodiment 4, an exemplary D/A converter will be described in which a deterioration in the distortion characteristics due to an influence of the parasitic capacitance of a common node of a differential switch is reduced.

Figure 7:
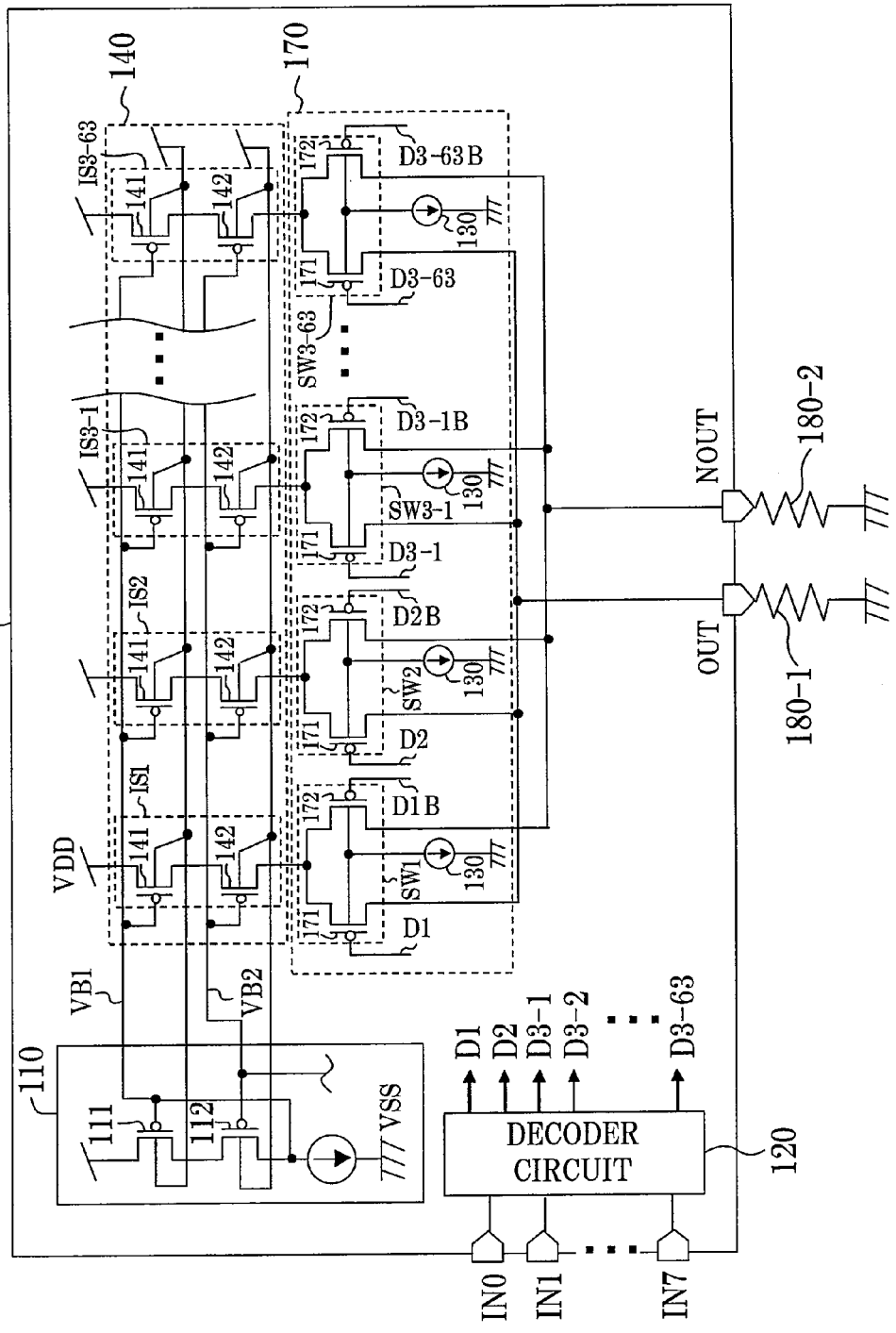
FIG. 7 is a block diagram showing a configuration of a D/A converter of Embodiment 4 of the present invention.

FIG. 7 is a block diagram showing a configuration of the D/A converter 500 of Embodiment 4 of the present invention. The D/A converter 500 is a variation of the D/A converter 300 of Embodiment 3. Specifically, in the D/A converter 500, a single forward body bias voltage generating current source 130 is not shared by a plurality of differential switches, and a forward body bias voltage generating current source 130 is provided for each differential switch. A forward body bias voltage generating current source 130 is connected to the back-gate terminals of transistors of each corresponding differential switch. Note that, in the D/A converter 500, the back-gate terminals of the current source transistor 141, the cascode transistor 142, the first bias transistor 111 and the second bias transistor 112 are connected to a power source.

In the D/A converter 500, the forward body bias voltage generating current sources 130 corresponding to the respective differential switches can each cause a current to flow through parasitic diodes existing between the source terminals and the back-gate terminals of the switch pair transistors of the corresponding differential switch. Thereby, in this embodiment, a forward body bias voltage can be generated for each differential switch, and at the same time, the forward body bias voltages are separately applied to the individual differential switches.

With such a configuration, an effect similar to that of the D/A converter 300 of Embodiment 3 is obtained. In addition, changes in voltage at the common source node of each differential switch when a control signal for controlling the differential switch is switched and when an output voltage changes, do not have an influence on the other differential switches.

Also, since the forward body bias voltage is generated by causing a constant current to flow through the parasitic diode using the source terminal voltage as a reference, when the voltage of the source terminal of each differential switch changes, the voltage of the back-gate terminal of each differential switch is determined, depending on the change. In other words, the voltage of the back-gate terminal also changes, depending on a change in voltage of the common source node of the transistors included in the differential switch. Thereby, it is possible to reduce a deterioration in distortion characteristics of the analog output due to the parasitic capacitance of the common source node of the differential switch.

Variation of Embodiment 4

Figure 8:
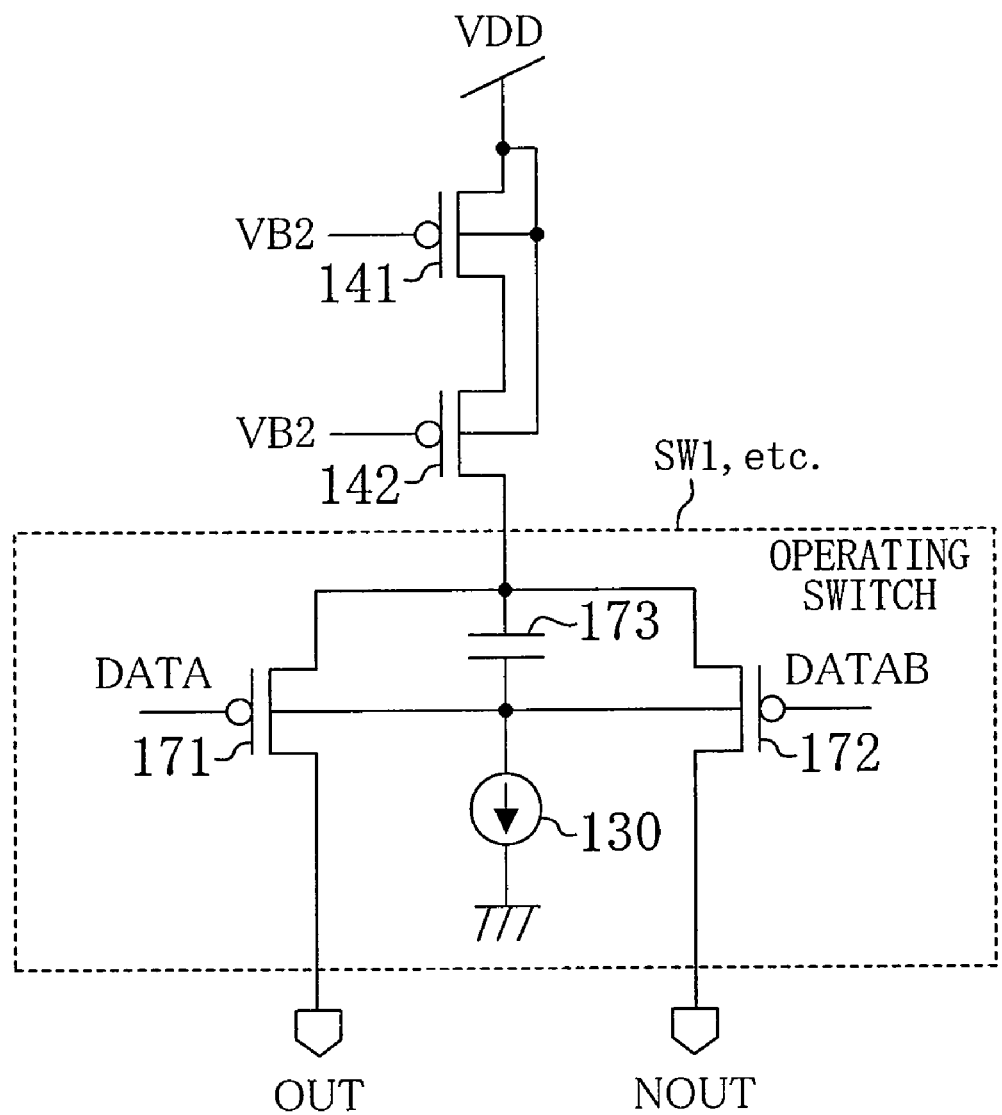
FIG. 8 is a diagram showing another exemplary configuration of a differential switch.

FIG. 8 is a diagram showing another exemplary configuration of the differential switch of the D/A converter 500. In this example, as shown in FIG. 8, a capacitance element 173 is additionally provided between the common source node and the back-gate terminal of each differential switch. With this configuration, for example, if this differential switch is applied to the D/A converters described above, the ability of causing the back-gate terminal voltage to follow a change in voltage of the common source node of each differential switch is enhanced. In other words, it is possible to further reduce a deterioration in distortion characteristics of the analog output due to the parasitic capacitance of the common source node of the differential switch.

Embodiment 5 of the Invention

Figure 9:
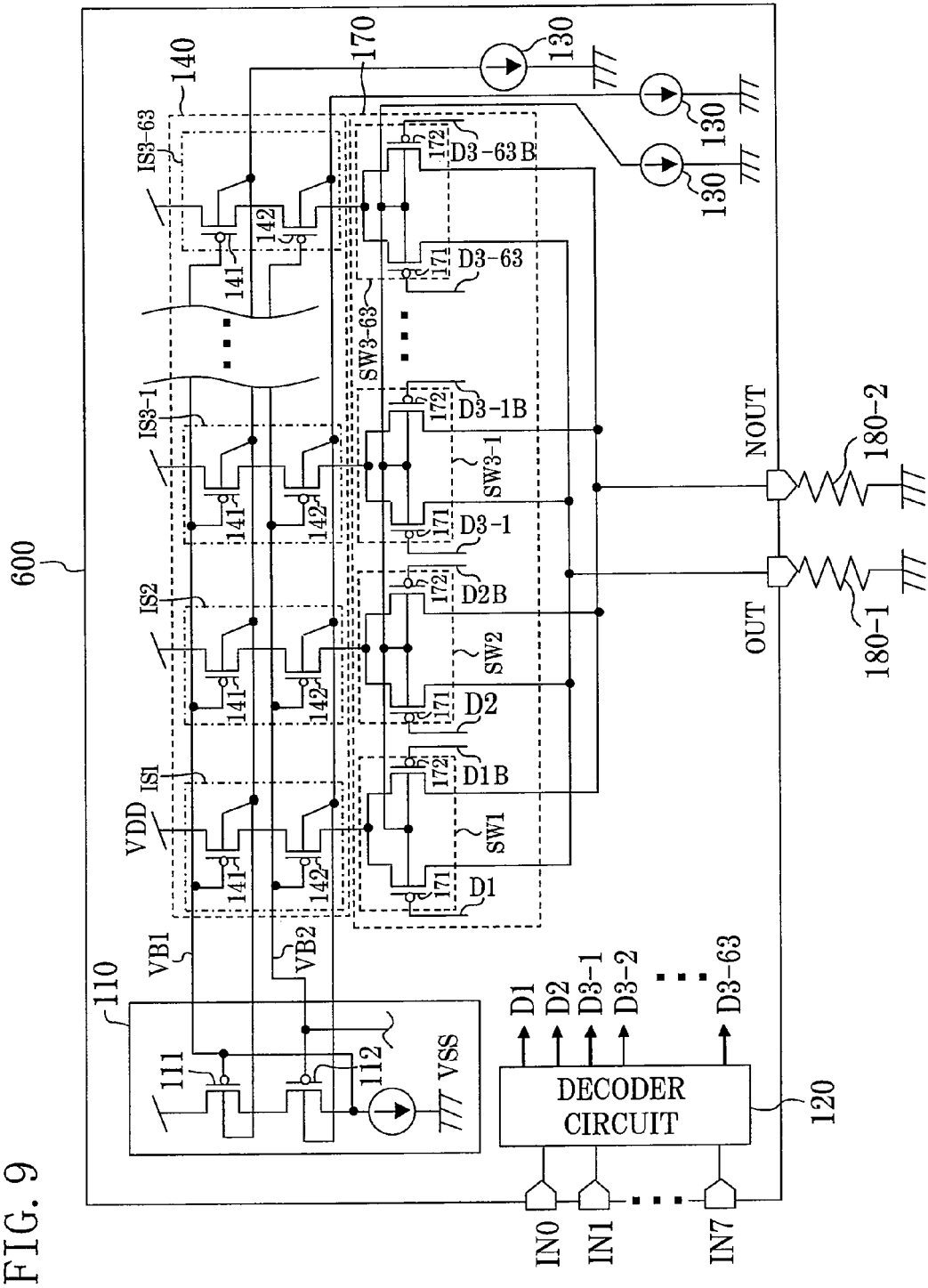
FIG. 9 is a block diagram showing a configuration of a D/A converter of Embodiment 5 of the present invention.

FIG. 9 is a block diagram showing a configuration of a D/A converter 600 according to Embodiment 5 of the present invention. The D/A converter 600 simultaneously has the configurations of Embodiments 1 to 3. Specifically, in the D/A converter 600, a forward body bias voltage generating current source 130 is connected to the back-gate terminals of the current source transistor 141 and the first bias transistor 111 and a forward body bias voltage is applied thereto, and another forward body bias voltage generating current source 130 is connected to the back-gate terminals of the cascode transistor 142 and the second bias transistor 112 and a forward body bias voltage is applied thereto. In addition, in order to apply a forward body bias voltage to the transistors of each differential switch, still another forward body bias voltage generating current source 130 is connected to the non-inversion output transistor 171 and the inversion output transistor 172 of each differential switch.

With such a configuration, the effects of Embodiments 1 to 3 can be simultaneously obtained in the D/A converter 600, so that a D/A converter for communications having considerably excellent characteristics can be achieved.

Specifically, according to this embodiment, as is similar to the D/A converter 100 of Embodiment 1, the relative accuracy of the current source transistor 141 included in each current source, i.e., the relative accuracy of the current of each current source, is improved. In other words, in the D/A converter 600, the linearity accuracy can be increased.

Also, as is similar to the D/A converter 200 of Embodiment 2, the gm/gds of the cascode transistor 142 included in the current source matrix is improved, so that the output impedance of the current source is improved. In other words, according to this embodiment, the linearity characteristics and the distortion characteristics (particularly, the frequency dependency) of the D/A converter can be improved.

Also, as is similar to the D/A converter 300 of Embodiment 3, the relative accuracy of the relative accuracy of the pair transistors included in the differential switch is increased. In addition, the gm/gds of the switch transistor is improved, and the output impedance of the current source is improved by a stack of the current source transistor, the cascode transistor and the differential switch transistor. Thereby, the distortion characteristics (particularly, the frequency dependency) of the D/A converter can be improved.

Note that, in this embodiment, forward body bias voltage generating current sources 130 are connected to all of the current source transistor, the cascode transistor and the differential switch transistor. Alternatively, forward body bias voltage generating current sources 130 may be connected to only two of the transistors (e.g., the current source transistor, the cascode transistor, and a pair of the differential switch transistors). Even in this case, a D/A converter having a sufficiently high level of performance can be obtained.

Also, in this embodiment, when a forward body bias voltage is applied to the differential switch, forward body bias voltage generating current sources 130 may be separately connected to individual differential switches as in Embodiment 4.

Other Embodiments of D/A Converter

Note that, in Embodiments 1 to 5 and the variations described above, the forward body bias voltage generating current source 130 may be set in accordance with an external control signal and may be set to have an optimal current value.

It has also been described in Embodiments 1 to 5 and the variations that a forward body bias voltage is applied by causing a current to flow through a parasitic diode existing between the source terminal and the back-gate terminal of each transistor (the current source transistor 141, etc.). Alternatively, a bias voltage generating circuit for generating a forward body bias voltage may be additionally provided, and the generated voltage may be applied to the back-gate terminals of the current source transistor 141 and the like.

It has also been described in Embodiments 1 to 5 and the variations that one of the outputs of the differential switch is connected to the analog non-inversion output terminal OUT, while the other output is connected to the analog inversion output terminal NOUT (differential output type D/A converter). Alternatively, one output of the differential switch may be connected to an analog output terminal, while the other output may be connected to a ground VSS (single end type D/A converter). Even in this case, the present invention is applicable. The differential output type D/A converter is typically employed for transmission in communications applications, and the single end type D/A converter is employed in video signal output applications and the like.

Embodiment 6 of the Invention

Figure 10:
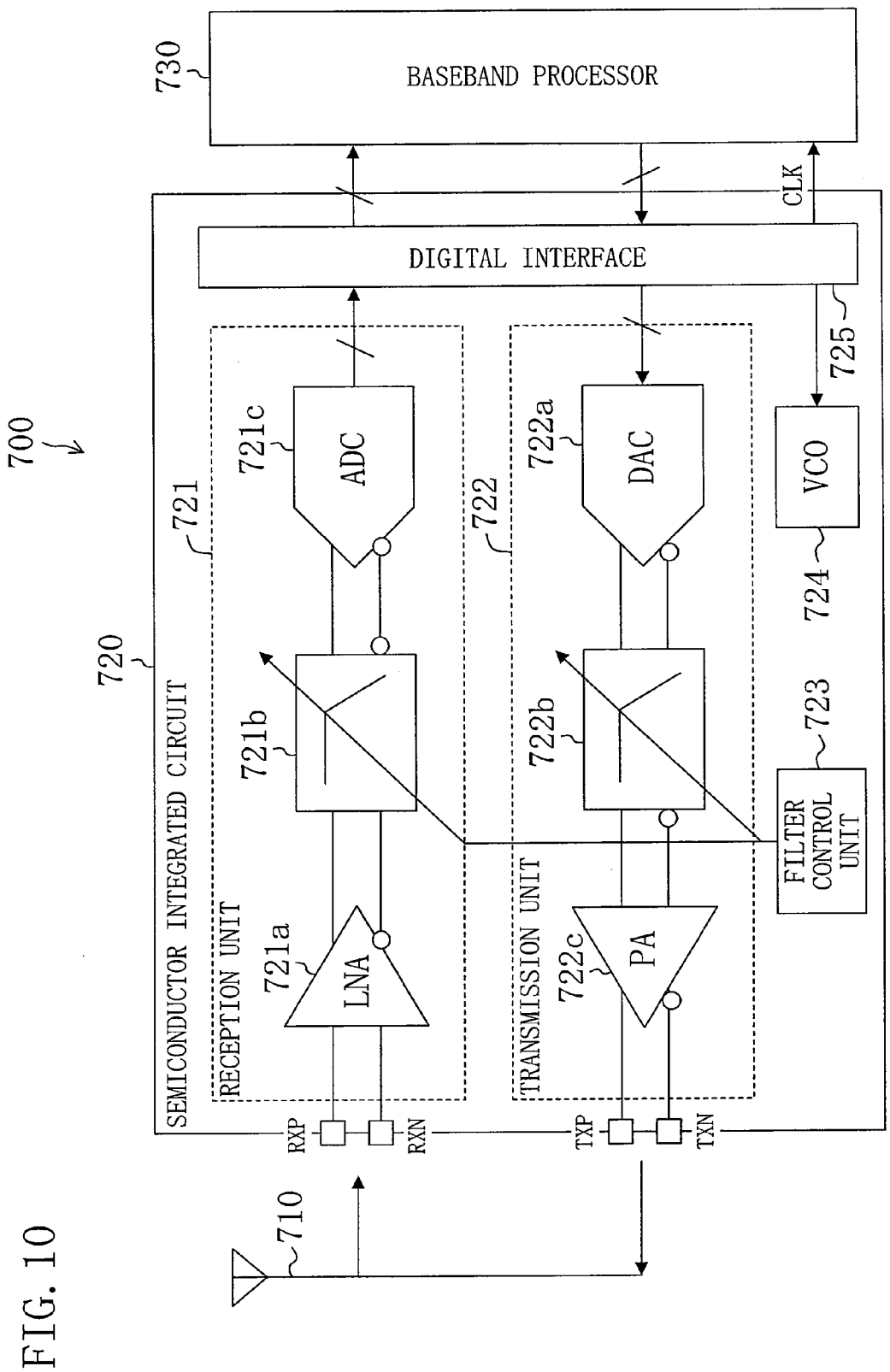
FIG. 10 is a block diagram showing a configuration of a communication apparatus of Embodiment 6 of the present invention.
Figure 11:
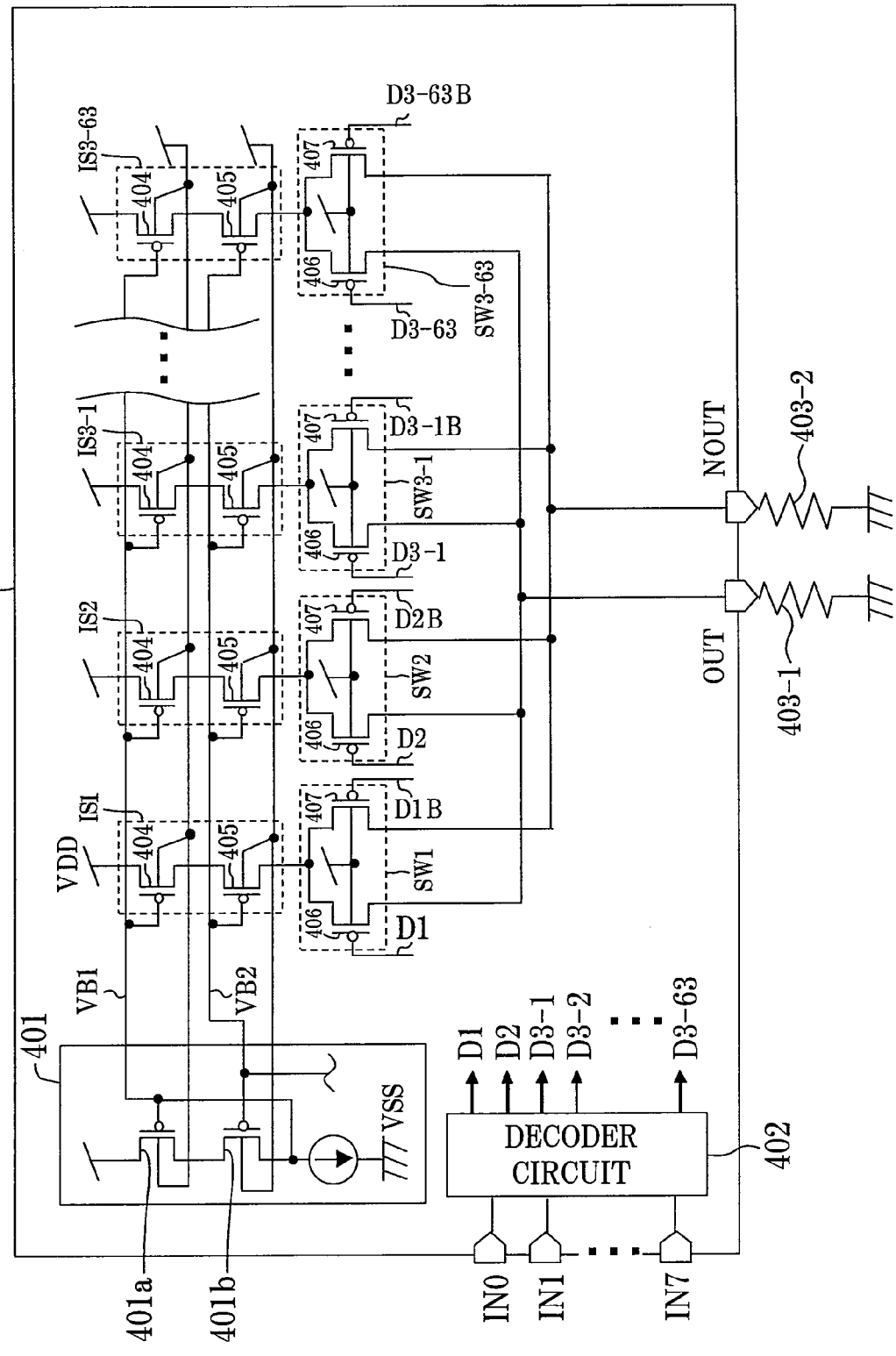
FIG. 11 is a diagram showing a circuit configuration of a conventional current steering D/A converter.

FIG. 10 is a block diagram showing a configuration of a communication apparatus 700 according to Embodiment 6 of the present invention. The communication apparatus 700 is implemented as, for example, a mobile telephone or the like.

As shown in FIG. 10, the communication apparatus 700 comprises an antenna 710, a semiconductor integrated circuit 720, and a baseband processor 730. The semiconductor integrated circuit 720 is a semiconductor integrated circuit to which the D/A converter of the present invention is applied and which mainly performs transmission and reception of a signal. A configuration of the semiconductor integrated circuit 720 will be described below. The baseband processor 730 processes a received signal and a signal to be transmitted.

(Configuration of Semiconductor Integrated Circuit 720)

The semiconductor integrated circuit 720 comprises a reception unit 721, a transmission unit 722, a filter control unit 723, a voltage control transmitter 724 (abbreviated to VCO in FIG. 10), and a digital interface 725.

The reception unit 721 converts a signal received by the antenna 710 into a digital signal and outputs the digital signal. Specifically, the reception unit 721 comprises a low-noise amplifier 721a (abbreviated to LNA in FIG. 10), a filter 721b, and a reception A/D converter 721c (abbreviated to ADC in FIG. 10). The low-noise amplifier 721a amplifies a signal received by the antenna 710. The filter 721b is a filter whose frequency characteristics can be tuned. The frequency characteristics are controlled by the filter control unit 723. The reception A/D converter 721c converts the output of the filter 721b into a digital signal and outputs the digital signal.

The transmission unit 722 converts an input digital signal into an analog signal and outputs the analog signal from the antenna 710. Specifically, the transmission unit 722 comprises a transmission D/A converter 722a (abbreviated to DAC in FIG. 10), a filter 722b, and a power amplifier 722c (abbreviated to PA in FIG. 10). The transmission D/A converter 722a is a D/A converter of the present invention (e.g., any of the D/A converters of Embodiments 1 to 5 and the variations can be employed). The transmission D/A converter 722a converts a digital signal input from the digital interface 725c into an analog signal and outputs the analog signal to the filter 722b. The filter 722b is a filter whose frequency characteristics can be tuned. The frequency characteristics are controlled by the filter control unit 723. The power amplifier 722c amplifies the output of the filter 722b and transmits the resultant output via the antenna 710.

The filter control unit 723 controls the frequency characteristics of the filters 721b and 722b as described above. The voltage control transmitter 724 generates a clock signal that is used in the baseband processor 730 and the like. The digital interface 725 mediates communication of data (digital signal) between the reception unit 721 and the baseband processor 730 and between the transmission unit 722 and the baseband processor 730. The digital interface 725 also controls the oscillation frequency of the voltage control transmitter 724 to output a clock signal CLK to the baseband processor 730.

(Operation of Communication Apparatus 700)

In the communication apparatus 700, when reception is performed, a signal received at the antenna 710 is input to the reception unit 721 of the semiconductor integrated circuit 720, and is converted into a digital signal via the low-noise amplifier 721a (LNA), the frequency-tuned filter 721b and the reception A/D converter 721c. Thereafter, the digital signal is transferred via the digital interface 725 to the baseband processor 730, in which the digital signal is subjected to signal processing.

On the other hand, when transmission is performed, a digital signal signal-processed by the baseband processor 730 is transferred to the semiconductor integrated circuit 720. Thereafter, the digital signal is input via the digital interface 725 to the transmission unit 722. In the transmission unit 722, the digital signal is converted into an analog signal by the transmission D/A converter 722a, and thereafter, the analog signal is transferred via the filter 722b and the power amplifier 722c to the antenna 710, which transmits the analog signal.

As described above, in this embodiment, since the semiconductor integrated circuit 720 employs a D/A converter of the present invention, a low-cost and high-performance semiconductor integrated circuit can be achieved. In other words, a higher level of performance can be imparted to the communication apparatus 700 and a low-cost communication system can be constructed.

INDUSTRIAL APPLICABILITY

The D/A converter of the present invention can provide a high level of accuracy while suppressing an increase in area thereof, and is useful as a D/A converter (DAC) for converting a digital signal into an analog signal, a semiconductor integrated circuit, a video apparatus, a communication apparatus or the like.

The invention claimed is:

1. A D/A converter comprising:
a plurality of current sources each including a transistor having a back-gate terminal connected to a body of the transistor, for converting an input digital signal into an analog signal by selecting paths of currents output from the plurality of current sources, depending on the digital signal, wherein
a forward body bias voltage is applied to the body via the back-gate terminal of the transistor included in each current source, and
the forward body bias voltage is generated by connecting a forward body bias voltage generating current source in series to a parasitic diode existing between a source terminal and the back-gate terminal of the transistor to which the forward body bias voltage is applied.

2. The D/A converter of claim 1, wherein the transistors of the current sources are arranged and separated into a current source transistor matrix including the current source transistors of the current sources and a cascode transistor matrix including the cascode transistors of the current sources.

3. The D/A converter of claim 2, wherein the forward body bias voltage generating current source is connected to a connection point provided at a center of the current source transistor matrix or the cascode transistor matrix.

4. The D/A converter of claim 2, wherein
a plurality of the forward body bias voltage generating current sources are provided,
one of the plurality of forward body bias voltage generating current sources is connected to a connection point provided at a center of the current source transistor matrix or the cascode transistor matrix, and
the other forward body bias voltage generating current sources are connected to positions that are symmetrical about the connection point.

5. The D/A converter of claim 2, wherein
the current source transistor matrix or the cascode transistor matrix is segmented, and
the forward body bias voltage generating current sources are provided for the respective corresponding segments.

6. The D/A converter of claim 1, wherein the forward body bias voltage generating current source is configured so that a current value is set by a control signal.

7. The D/A converter of claim 1, further comprising:
a bias voltage generating circuit for generating a predetermined voltage,
wherein the forward body bias voltage is the voltage generated by the bias voltage generating circuit.

8. A semiconductor integrated circuit comprising the D/A converter of claim 1.

9. A video apparatus comprising the semiconductor integrated circuit of claim 8.

10. A communication apparatus comprising the semiconductor integrated circuit of claim 8.

11. A D/A converter comprising:
a plurality of current sources each including a transistor having a back-gate terminal connected to a body of the transistor, for converting an input digital signal into an analog signal by selecting paths of currents output from the plurality of current sources, depending on the digital signal, wherein
a forward body bias voltage is applied to the body via the back-gate terminal of the transistor included in each current source, and
each current source includes a current source transistor and a cascode transistor, and
the forward body bias voltage is applied to at least one of the back-gate terminal of the current source transistor and the back-gate terminal of the cascode transistor.

12. The D/A converter of claim 11, further comprising:
a bias circuit for outputting a first bias voltage and a second bias voltage,
wherein the bias circuit includes a first bias transistor and a second bias transistor, the first bias transistor and the current source transistor forming a current mirror pair and the second bias transistor and the cascode transistor forming a current mirror pair, and
a common forward body bias voltage is applied to a back-gate terminal of the current source transistor of each current source and a back-gate terminal of the first bias transistor.

13. The D/A converter of claim 12, wherein the first bias transistor is provided in a region in which the current source transistor matrix is provided.

14. The D/A converter of claim 11, further comprising:
a bias circuit for outputting a first bias voltage and a second bias voltage,
wherein the bias circuit includes a first bias transistor and a second bias transistor, the first bias transistor and the current source transistor forming a current mirror pair and the second bias transistor and the cascode transistor forming a current mirror pair, and
a common forward body bias voltage is applied to a back-gate terminal of the cascode transistor of each current source and a back-gate terminal of the second bias transistor.

15. The D/A converter of claim 14, wherein the second bias transistor is provided in a region in which the cascode transistor matrix is provided.

16. The D/A converter of claim 11, wherein the back-gate terminal of the current source transistor and the back-gate terminal of the cascode transistor are a common back-gate terminal shared by the current source transistor and the cascode transistor, and the forward body bias voltage is generated by connecting a forward body bias voltage generating current source in series to a parasitic diode existing between a source terminal and the back-gate terminal of the current source transistor.

17. The D/A converter of claim 16, wherein the forward body bias voltage generating current source is configured so that a current value is set by a control signal.

18. A D/A converter comprising:
a plurality of current sources each including a transistor having a back-gate terminal connected to a body of the transistor, for converting an input digital signal into an analog signal by selecting paths of currents output from the plurality of current sources, depending on the digital signal, wherein
the D/A converter further includes a plurality of differential switches connected to the respective corresponding current sources,
each of the differential switches includes transistors that are switched, depending on the digital signal given a path of a current from the corresponding current source,
a forward body bias voltage is applied to the body via the back-gate terminals of the transistors of each of the differential switches, and
the forward body bias voltage is generated by connecting a forward body bias voltage generating current source in series to a parasitic diode existing between a source terminal and the back-gate terminal of the transistor to which the forward body bias voltage is applied.

19. The D/A converter of claim 18, wherein the forward body bias voltage applied to the back-gate terminals of the transistors of each of the differential switches, is generated by connecting a forward body bias voltage generating current source in series to parasitic diodes existing between source terminals and the back-gate terminals of the transistors of the differential switch.

20. The D/A converter of claim 19, wherein
the forward body bias voltage generating current source is provided for each of the differential switches, and
to the back-gate terminals of the transistors of each of the differential switches, the corresponding forward body bias voltage generating current source is connected.

21. The D/A converter of claim 18, further comprising:
a bias voltage generating circuit for generating a predetermined voltage,
wherein the forward body bias voltage is the voltage generated by the bias voltage generating circuit.

22. A semiconductor integrated circuit comprising the D/A converter of claim 18.

23. A video apparatus comprising the semiconductor integrated circuit of claim 22.

24. A communication apparatus comprising the semiconductor integrated circuit of claim 22.

25. A D/A converter comprising:
a plurality of current sources each including a transistor having a back-gate terminal connected to a body of the transistor, for converting an input digital signal into an analog signal by selecting paths of currents output from the plurality of current sources, depending on the digital signal, wherein
the D/A converter further includes a plurality of differential switches connected to the respective corresponding current sources,
each of the differential switches includes transistors that are switched, depending on the digital signal given a path of a current from the corresponding current source,
a forward body bias voltage is applied to the body via the back-gate terminals of the transistors of each of the differential switches,
the forward body bias voltage is generated by connecting a forward body bias voltage generating current source in series to a parasitic diode existing between a source terminal and the back-gate terminal of the transistor to which the forward body bias voltage is applied
the forward body bias voltage applied to the back-gate terminals of the transistors of each of the differential switches, is generated by connecting a forward body bias voltage generating current source in series to parasitic diodes existing between source terminals and the back-gate terminals of the transistors of the differential switch, and
the forward body bias voltage generating current source is configured so that a current value is set by a control signal.

26. A D/A converter comprising:
a plurality of current sources each including a transistor having a back-gate terminal connected to a body of the transistor, for converting an input digital signal into an analog signal by selecting paths of currents output from the plurality of current sources, depending on the digital signal, wherein
the D/A converter further includes a plurality of differential switches connected to the respective corresponding current sources,
each of the differential switches includes transistors that are switched, depending on the digital signal given a path of a current from the corresponding current source,
a forward body bias voltage is applied to the body via the back-gate terminals of the transistors of each of the differential switches,
each current source includes a current source transistor and a cascode transistor, and
the forward body bias voltage is applied to at least one of the back-gate terminal of the current source transistor and the back-gate terminal of the cascode transistor.

27. A differential switch comprising:
a pair of transistors having source terminals connected to each other and having a back-gate terminal connected to a body of the pair of the transistors, a bias voltage generating circuit generating a forward body bias voltage by causing a current flowing through a parasitic diode between the source terminal and a back-gate terminal, thereby applying the forward body bias voltage to the back-gate terminal, and the forward body bias voltage is generated by connecting a forward body bias voltage generating current source in series to a parasitic diode existing between a source terminal and the back-gate terminal of the transistor to which the forward body bias voltage is applied.

28. A differential switch comprising:

a pair of transistors having source terminals connected to each other and having a back-gate terminal connected to a body of the pair of the transistors, a bias voltage generating circuit generating a forward body bias voltage by causing a current flowing through a parasitic diode between the source terminal and a back-gate terminal, thereby applying the forward body bias voltage to the back-gate terminal, and a capacitance element is connected between the source terminal and the back-gate terminal.

29. A D/A converter comprising:

a plurality of current sources; and a differential switch provided for each of the current sources and connected to a path of a current output from the each of the current sources, including;

a pair of transistors having source terminals connected to each other and having a back-gate terminal connected to a body of the pair of the transistors, and a bias voltage generating circuit generating a forward body bias voltage by causing a current flowing through a parasitic diode between the source terminal and a back-gate terminal, thereby applying the forward body bias voltage to the back-gate terminal, wherein paths of currents output from the plurality of current sources are selected by the differential switches in accordance with an input digital signal, thereby converting the input digital signal into an analog signal, and the forward body bias voltage is generated by connecting a forward body bias voltage generating current source in series to a parasitic diode existing between a source terminal and the back-gate terminal of the transistor to which the forward body bias voltage is applied.

30. A D/A converter comprising:

a transistor having a back-gate terminal connected to a body of the transistor, wherein a forward body bias voltage is applied to the body via the back gate of the transistor included in the D/A converter, and the forward body bias voltage is generated by connecting a forward body bias voltage generating current source in series to a parasitic diode existing between a source terminal and the back-gate terminal of the transistor to which the forward body bias voltage is applied.

* * * * *